US009659995B2

(12) United States Patent
Lee et al.

(10) Patent No.: US 9,659,995 B2
(45) Date of Patent: May 23, 2017

(54) FLEXIBLE DISPLAY DEVICE

(71) Applicant: SAMSUNG DISPLAY CO., LTD., Yongin, Gyeonggi-Do (KR)

(72) Inventors: Seung-Bae Lee, Yongin (KR); Ja-Eun Lee, Yongin (KR)

(73) Assignee: Samsung Display Co., Ltd., Yongin, Gyeonggi-do (KR)

(*) Notice: Subject to any disclaimer, the term of this patent is extended or adjusted under 35 U.S.C. 154(b) by 377 days.

(21) Appl. No.: 14/290,405

(22) Filed: May 29, 2014

(65) Prior Publication Data
US 2015/0091413 A1 Apr. 2, 2015

(30) Foreign Application Priority Data

Oct. 1, 2013 (KR) .......... 10-2013-0117586

(51) Int. Cl.
H01L 41/09 (2006.01)
H01L 27/20 (2006.01)

(52) U.S. Cl.
CPC .......... H01L 27/20 (2013.01); H01L 41/0986 (2013.01)

(58) Field of Classification Search
CPC ................................... H01L 41/0986
USPC ................................. 310/338, 339
See application file for complete search history.

(56) References Cited

U.S. PATENT DOCUMENTS

| 2006/0125777 | A1 | 6/2006 | Daniel et al. |
| 2007/0279315 | A1 | 12/2007 | Laves et al. |
| 2008/0303782 | A1* | 12/2008 | Grant .................. G06F 1/1615 345/156 |
| 2009/0212310 | A1 | 8/2009 | Shim et al. |
| 2011/0043077 | A1* | 2/2011 | Yeh .................. F03G 7/005 310/338 |
| 2011/0304810 | A1 | 12/2011 | Kim et al. |
| 2012/0144743 | A1 | 6/2012 | Piney |
| 2012/0154999 | A1 | 6/2012 | Park |
| 2012/0324616 | A1 | 12/2012 | Hyde et al. |
| 2013/0069859 | A1 | 3/2013 | Saila et al. |

FOREIGN PATENT DOCUMENTS

| JP | 2006-171735 | 6/2006 |
| JP | 2013-12494 | 1/2013 |
| KR | 10-2011-0001859 A | 12/2011 |
| KR | 10-2011-0136181 | 12/2011 |

OTHER PUBLICATIONS

Kim et al. A Transparent and Stretchable Graphene-Based Actuator for Tactile Display, Nanotechnology, 24 (2013) 145501, pp. 1-7.
Koo et al. Wearable Tactile Display Based on Soft Actuator, vol. 01 (Sep. 2006), Journal of Korean Robotics Society, pp. 89-101.

* cited by examiner

Primary Examiner — Derek Rosenau
(74) Attorney, Agent, or Firm — Lee & Morse, P.C.

(57) ABSTRACT

A flexible display device includes a display panel having pliability and a dielectric elastomer unit on the display panel. The dielectric elastomer unit is reversibly deformable by an applied voltage to provide stiffness to the display panel.

11 Claims, 6 Drawing Sheets

FLEXIBLE DISPLAY DEVICE

CROSS-REFERENCE TO RELATED APPLICATION

Korean Patent Application No. 10-2013-0117586, filed on Oct. 1, 2013, in the Korean Intellectual Property Office, and entitled: "Flexible Display Device," is incorporated by reference herein in its entirety.

BACKGROUND

1. Field

Embodiments relate to a flexible display device that may be stiffened.

2. Description of the Related Art

In general, a flexible display device that has pliability by forming a display unit on a flexible substrate such as a polyimide substrate has an advantage in that when the flexible display device is to be carried, the flexible display device may be deformed to be reduced in volume.

SUMMARY

A flexible display device is provided that include a display panel having pliability a dielectric elastomer unit on the display panel. The dielectric elastomer unit is reversibly deformable by an applied voltage to provide stiffness to the display panel. The flexible display device may include a plurality of the dielectric elastomer units with adjacent dielectric elastomer units being separated from each other at predetermined intervals on the display panel in the absence of the applied voltage. A separation between the adjacent dielectric elastomer units by the predetermined intervals is removable by the applied voltage to provide the stiffness of the display panel. Each of the plurality of dielectric elastomer units may include a first electrode and a second electrode that face each other, and an electroactive polymer layer that is between the first electrode and the second electrode. The electroactive polymer layer may include any one material selected from polyvinylidene fluoride (PVDF), polydimethyl siloxane (PDMS), and polyvinylidene fluoride-co-trifluoroethylene (PVFT). Each of the first electrode and the second electrode may include indium tin oxide (ITO).

The display panel may have a first and a second surface, which may, for example, face away from each other. The plurality of dielectric elastomer units may be provided on the first surface, the second surface, or both. The plurality of dielectric elastomer units may be provided inside the display panel. The plurality of dielectric elastomer units may be provided along an edge of the display panel. The edge may be positioned, for example, between and/or continuous with the first and/or second surfaces. The plurality of dielectric elastomer units may also be provided along a transversal line that crosses the display panel, for example, crossing the first surface, the second surface, the edge, or a combination thereof. The plurality of dielectric elastomer units may be uniformly provided on an entire surface of the display panel. Shapes of the plurality of dielectric elastomer units may include polygonal shapes. The adjacent dielectric elastomer units may be deformable to be in lateral contact with each other by the applied voltage. The predetermined intervals may be of uniform length.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
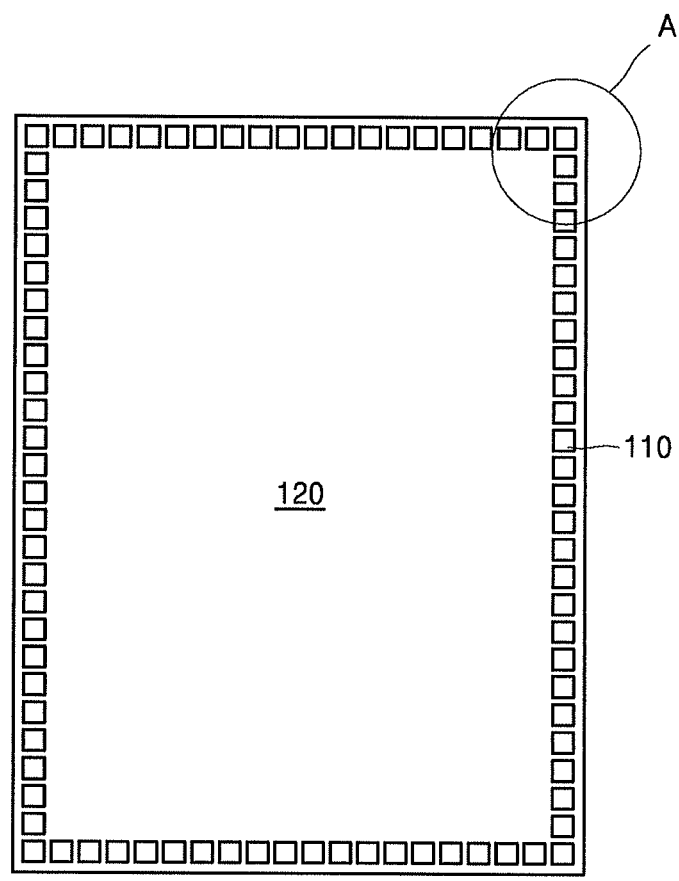
FIG. 1 illustrates a plan view of a flexible display device.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The singular forms "a," "an" and "the" are intended to include the plural forms as well, unless the context clearly indicates otherwise. The terms "comprises" and/or "comprising" used herein specify the presence of stated features or components, but do not preclude the presence or addition of one or more other features or components. When a layer, region, or element is referred to as being "formed on," another layer, region, or element, it can be directly or indirectly formed on the other layer, region, or element. That is, for example, intervening layers, regions, or elements may be present. Sizes of elements may be exaggerated for convenience of explanation. In other words, because sizes and thicknesses of elements in the drawings are arbitrarily illustrated for convenience of explanation, the following embodiments are not limited thereto. When a certain embodiment may be implemented differently, a specific process order may be performed differently from the described order. For example, two consecutively described processes may be performed substantially at the same time or performed in an order opposite to the described order.

FIG. 1 illustrates a plan view of a flexible display device 100. A flexible display device may be pliably deformed to be reduced in volume. Accordingly, the flexible display device may be conveniently carried. However, such an advantage of the flexible display device may become a disadvantage. That is, it is convenient and comfortable for a user to see a screen when a display device is fixed in a flat state. If the display device is in a pliably deformed state, the screen may be bent, thereby making it difficult to see an even screen without distortion. However, the flexible display device 100 of FIG. 1 may improve both portability and convenience of use.

Figure 3A:
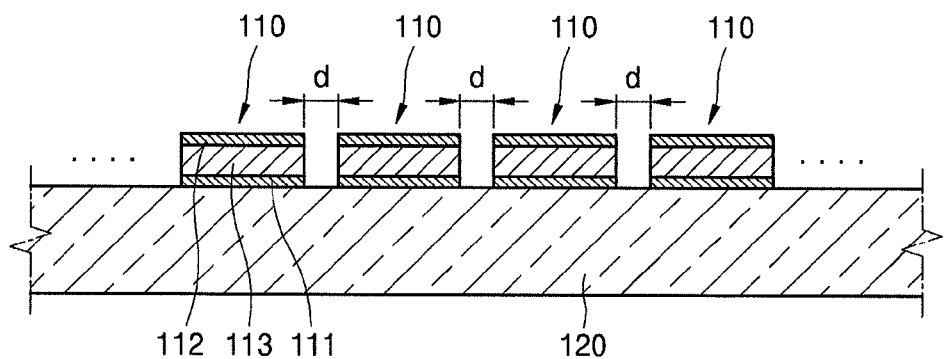
FIGS. 3A and 3B illustrate cross-sectional views for explaining an operation of dielectric elastomer units of the flexible display device of FIG. 1.

As shown in FIG. 1, the flexible display device 100 may include a display panel 120 that has pliability and a dielectric elastomer unit 110 attached to one surface of the display panel 120. The display panel 120 may have a structure in which a thin film transistor (TFT) and a light-emitting device for forming an image and an encapsulation layer for covering and protecting the TFT and the light-emitting device are stacked on a pliable flexible substrate. The display panel 120 may use the pliable flexible substrate instead of a hard glass substrate. Accordingly, the display panel 120 may be freely bent within an allowable range of its pliability. The dielectric elastomer unit 110 may be provided along an edge of one surface of the display panel 120. The dielectric elastomer unit 110 may include first and second electrodes 111 and 112 that face each other and an electroactive polymer layer 113 between the first and second electrodes 111 and 112, for example, as shown in FIG. 3A. When a voltage is applied between the first and second electrodes 111 and 112, for example, the electroactive polymer layer 113 may be extended in an in-plane direction.

Figure 2:
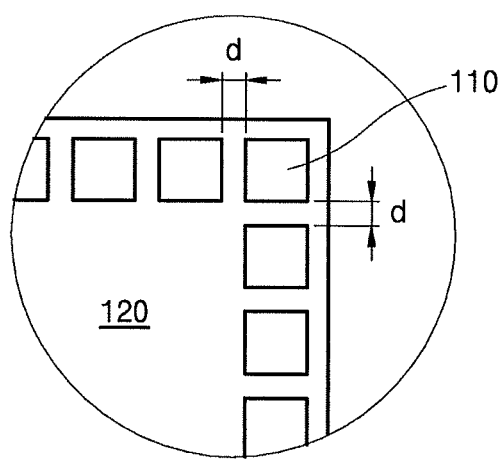
FIG. 2 illustrates an enlarged plan view of portion A of FIG. 1.

Referring to FIG. 2, a plurality of the dielectric elastomer units 110 may be arranged at predetermined intervals 'd' along the edge of the display panel 120. Due to the intervals 'd,' although the dielectric elastomer units 110 may surround the edge of the display panel 120, the display panel 120 may be pliably deformed without being affected by the dielectric elastomer units 110. If there are no intervals 'd,' even when the display panel 120 is so pliable, because the dielectric elastomer units 110 that seamlessly surround the edge of the display panel 120 are hard, the display panel 120 may not be readily pliably bent, thereby resulting in stiffness. Accordingly, if the display panel 120 is to be stiffly unfolded, the display panel 120 may not be easily bent by removing the intervals 'd.' The dielectric elastomer units 110 may be used to adjust a pliable state or a stiff state of the display panel 120 using this approach.

Figure 3B:
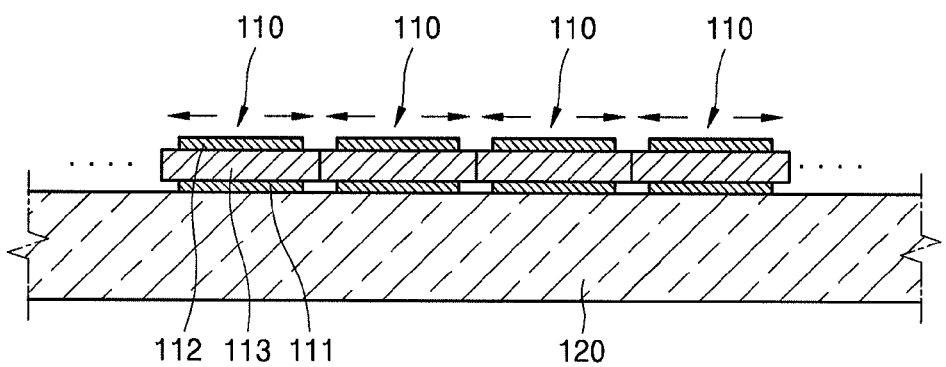

FIGS. 3A and 3B illustrate cross-sectional views for explaining an operation of the dielectric elastomer units 110. Each of the dielectric elastomer units 110 may include the first and second electrodes 111 and 112 and the electroactive polymer layer 113 that is between the first and second electrodes 111 and 112. When, for example, current does not flow and a voltage is not applied between the first and second electrodes 111 and 112 as shown in FIG. 3A, the electroactive polymer layer 113 may be maintained at its initial state where the electroactive polymer layer 113 is not extended. Accordingly, the intervals 'd' between the dielectric elastomer units 110 may be maintained and the display panel 120 may be softly bent. When, for example, a voltage is applied between the first and second electrodes 111 and 112, a length of the electroactive polymer layer 113 may be increased, for example, in an in-plane direction as shown in FIG. 3B, and the intervals 'd' between the dielectric elastomer units 110 may be removed due to the electroactive polymer layer 113. The dielectric elastomer units 110 may seamlessly surround and securely hold the edge of the display panel 120. Accordingly, the display panel 120 may not be easily bent, and the display panel 120 may be used while being stiffly unfolded. By contrast, when, for example, the voltage applied between the first and second electrodes 111 and 112 is turned off, the electroactive polymer layer 113 may return to the state of FIG. 3A and the display panel 120 may return to the state where the display panel 120 may be pliably deformed. As such, the display panel 120 may be adjusted to a state where the display panel 120 may be pliably bent or to a state where the display panel 120 may be stiffly unfolded by using the dielectric elastomer units 110.

Polyvinylidene fluoride (PVDF), polydimethyl siloxane (PDMS), or polyvinylidene fluoride-co-trifluoroethylene (PVFT) may be used as a material of the electroactive polymer layer 113, and an indium tin oxide (ITO) material may be used as a material of each of the first and second electrodes 111 and 112. Any suitable material may be used. For example, suitable materials include those that permit the material to be extended in an in-plane direction and remove the separation by the intervals 'd' when a voltage is applied between the first and second electrodes 111 and 112.

The flexible display device 100 may be used, for example, as follows. First, when the flexible display device 100 is not used, because a voltage is not applied to the dielectric elastomer units 110, for example, as shown in FIG. 3A, the intervals 'd' may be maintained, and thus the display panel 120 may be freely bent. The display panel 120 may be folded or rolled to be carried. When the flexible display device 100 is to be used, a voltage is applied between the first and second electrodes 111 and 112 of each of the dielectric elastomer units 110. Accordingly, the electroactive polymer layer 113 is extended in an in-plane direction to remove the separation by the intervals 'd,' for example, as shown in FIG. 3B, and the display panel 120 may be changed to a state where the display panel 120 may not be easily bent. In this state, when, for example, the display panel 120 is driven, an even screen may be seen. Next, when, for example, the use of the flexible display device 100 ends, the voltage applied to the dielectric elastomer units 110 may be turned off and the flexible display device 100 may return to a state where the flexible display device 100 may be pliably bent. Because the display panel 120 may be controlled to be in a pliable state or a stiff state as the dielectric elastomer units 110 are driven, the display panel 120 may be bent and stored to be carried or unfolded flat to be used. When, for example, the flexible display device 100 is used, both portability and convenience of use may be improved.

Figure 4:
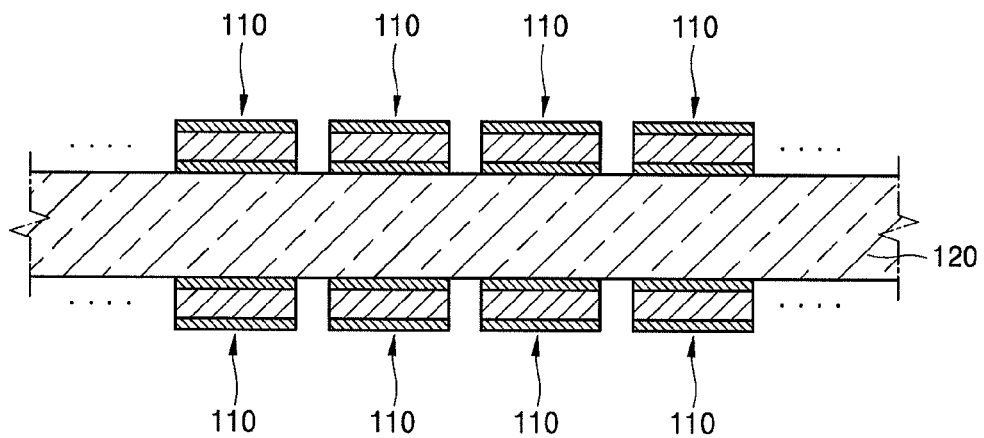
FIGS. 4 through 8C illustrate views of modifications of the flexible display device of FIG. 1.
Figure 5:
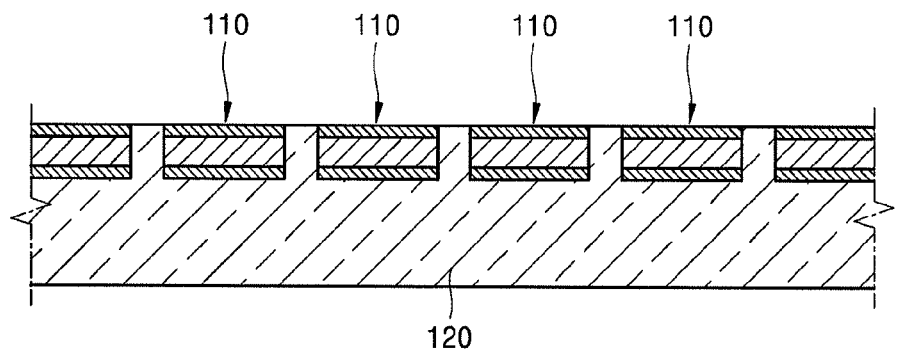

Although the dielectric elastomer units 110 may be provided on only one surface of the display panel 120 in some embodiments described herein, the dielectric elastomer units 110 may be provided on both surfaces of the display panel 120, for example, as shown in FIG. 4. In this case, stiffness may be uniformly provided to both surfaces of the display panel 120. The dielectric elastomer units 110 may be provided inside the display panel 120, for example, as shown in FIG. 5. For example, the dielectric elastomer units 110 may be provided inside the encapsulation layer of the display panel 120.

Figure 6:
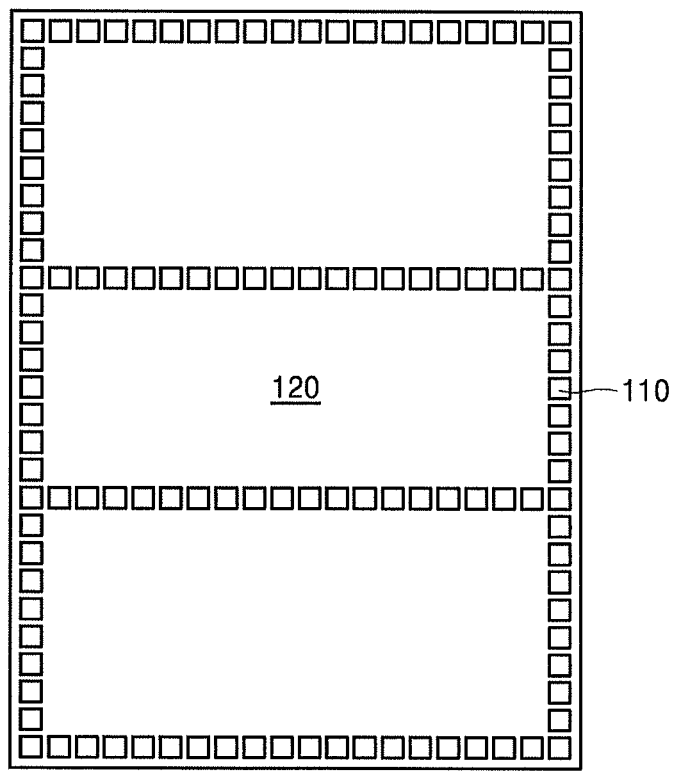
Figure 7:
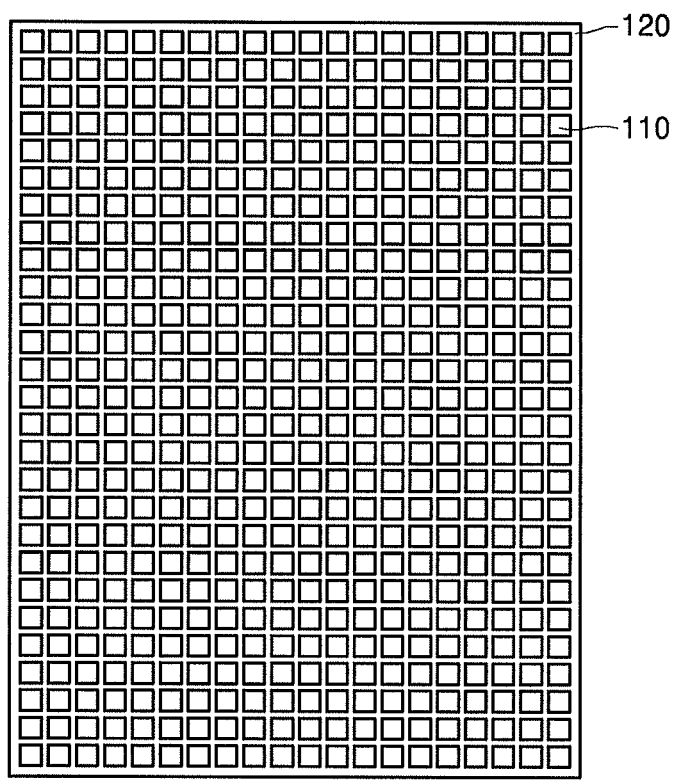

Although the dielectric elastomer units 110 are provided only along the edge of the display panel 110 in some embodiments described herein, in other embodiments, the dielectric elastomer units 110 may also be provided along a transversal line that crosses the display panel 120, for example, as shown in FIG. 6. The dielectric elastomer units 110 may be uniformly arranged on one entire surface of the display panel 120, for example, as shown in FIG. 7. Intervals may be non-uniform, or a combination of uniform and non-uniform intervals may be employed. Intervals may be uniform across a surface or edge, or may be uniform only in one or more portions thereof. There may initially be intervals 'd' between the dielectric elastomer units 110, and the intervals 'd' may then be removed as the electroactive polymer layer 113 is extended, for example, in an in-plane direction when a voltage is applied. The predetermined intervals may be of uniform or non-uniform length.

Figure 8A:
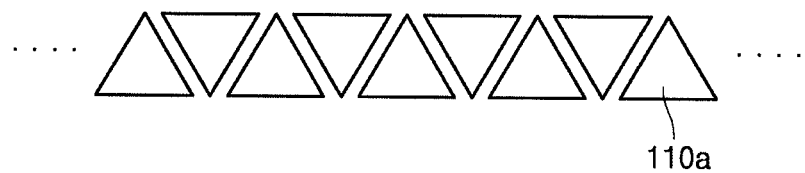
Figure 8B:
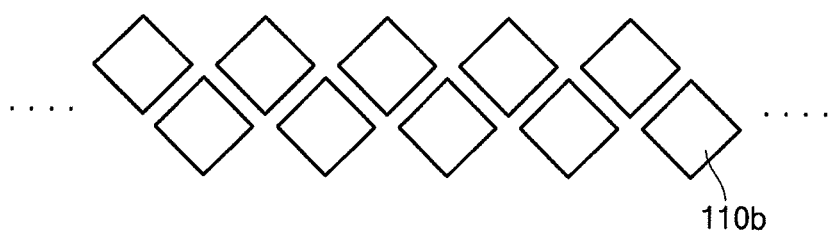
Figure 8C:
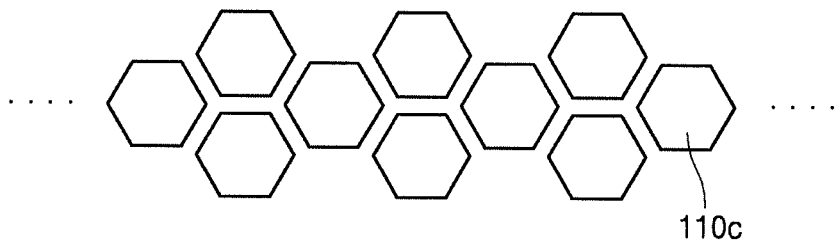

Although the dielectric elastomer units 110 may have square shapes in some embodiments described herein, in other embodiments, the dielectric elastomer units 110 may have any of various polygonal shapes, for example, such as triangular shapes 110a as shown in FIG. 8A, diamond shapes 110b as shown in FIG. 8B, or hexagonal shapes 110c as shown in FIG. 8C. Polygons of any suitable number of sides, length of sides, and degree of angles may be employed. Suitable regular and/or suitable irregular polygons may be used as shapes. Dielectric elastomer units may be used in any suitable combination of sizes and/or shapes, polygonal or otherwise.

By way of summation and review, a flexible display device having at least one dielectric elastomer unit is provided herein that is configured to vary in stiffness depending on the presence or absence of an applied voltage. When the flexible display device is used, for example, because the display panel may be pliably deformed and stored to be carried and may be unfolded flat to be used by driving the dielectric elastomer units, both portability and convenience of use may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A flexible display device, comprising:
a display panel having pliability; and
a plurality of dielectric elastomer units that are reversibly deformable by an applied voltage, the dielectric elastomer units each including a first electrode and a second electrode that face each other, and an electroactive polymer layer between the first electrode and the second electrode, the electroactive polymer layer being deformable to extend in an in-plane direction by an applied voltage between the first electrode and the second electrode, and the dielectric elastomer units being located on the display panel with respect to each other such that adjacent dielectric elastomer units are separated from each other at predetermined intervals on the display panel in the absence of the applied voltage and are put into lateral contact with each other by the applied voltage to provide stiffness to the display panel.

2. The flexible display device as claimed in claim 1, wherein the electroactive polymer layer includes any one of polyvinylidene fluoride (PVDF), polydimethyl siloxane (PDMS), and polyvinylidene fluoride-co-trifluoroethylene (PVFT).

3. The flexible display device as claimed in claim 1, wherein each of the first electrode and the second electrode includes indium tin oxide (ITO).

4. The flexible display device as claimed in claim 1, wherein display panel includes a first surface and a second surface, and the plurality of dielectric elastomer units are on the first surface.

5. The flexible display device as claimed in claim 4, wherein the plurality of dielectric elastomer units are on both the first surface and the second surface.

6. The flexible display device as claimed in claim 1, wherein the plurality of dielectric elastomer units are inside the display panel.

7. The flexible display device as claimed in claim 1, wherein the plurality of dielectric elastomer units are along an edge of the display panel.

8. The flexible display device as claimed in claim 7, wherein the plurality of dielectric elastomer units are also along a transversal line that crosses the display panel.

9. The flexible display device as claimed in claim 1, wherein the plurality of dielectric elastomer units are uniformly spaced on an entire surface of the display panel.

10. The flexible display device as claimed in claim 1, wherein shapes of the dielectric elastomer units include polygonal shapes.

11. The flexible display device as claimed in claim 1, wherein the predetermined intervals are of uniform length.

* * * * *